United States Patent
Shizuya et al.

(10) Patent No.: US 8,581,608 B2
(45) Date of Patent: Nov. 12, 2013

(54) APPARATUS AND METHOD FOR DETECTING ABNORMALITY IN SOLAR CELL POWER GENERATION SYSTEM

(75) Inventors: Osamu Shizuya, Osaka (JP); Jun Ishida, Osaka (JP); Hideki Furubayashi, Osaka (JP); Yukitaka Miyata, Osaka (JP)

(73) Assignee: Onamba Co., Ltd. (JP)

( * ) Notice: Subject to any disclaimer, the term of this patent is extended or adjusted under 35 U.S.C. 154(b) by 378 days.

(21) Appl. No.: 13/058,327

(22) PCT Filed: May 22, 2009

(86) PCT No.: PCT/JP2009/002264
§ 371 (c)(1),
(2), (4) Date: Feb. 9, 2011

(87) PCT Pub. No.: WO2010/125612
PCT Pub. Date: Nov. 4, 2010

(65) Prior Publication Data
US 2011/0133764 A1    Jun. 9, 2011

(30) Foreign Application Priority Data
May 1, 2009   (JP) .................................. 2009-111698

(51) Int. Cl.
*G01R 31/00* (2006.01)

(52) U.S. Cl.
USPC ...... 324/750.02; 320/101; 320/150; 320/152; 320/157; 320/158; 320/159; 320/162; 320/163; 320/164; 307/43; 307/44; 307/45; 307/46; 307/38; 324/500; 324/512; 324/522; 361/78; 361/79; 361/86; 361/87; 361/88; 361/90; 361/91.1; 361/92; 361/93.8

(58) Field of Classification Search
USPC ......... 320/101, 150, 152, 157, 158, 159, 162, 320/164; 307/38, 43, 44, 45, 46; 324/500, 324/512, 522, 750.02; 361/78, 79, 86, 87, 361/88, 90, 91.1, 92, 93.8
See application file for complete search history.

(56) References Cited

U.S. PATENT DOCUMENTS

| 6,278,052 B1 * | 8/2001 | Takehara et al. ............. 136/244 |
| 8,204,709 B2 * | 6/2012 | Presher et al. ................. 702/88 |

FOREIGN PATENT DOCUMENTS

| JP | 64002537 | | 1/1989 | |
| JP | 64002537 U | * | 1/1989 | ............... G05F 1/67 |

(Continued)

OTHER PUBLICATIONS

The International Bureau of WIPO, International Search Report in connection with corresponding International Application No. PCT/JP2009/002264 dated Nov. 17, 2011, 4 pages.

*Primary Examiner* — Patrick Assouad
*Assistant Examiner* — Sean Curtis
(74) *Attorney, Agent, or Firm* — Kolisch Hartwell, P.C.

(57) ABSTRACT

The present invention provides an apparatus for easily detecting an abnormal status of power generation of a solar cell panel in a solar cell power generation system having the power generation of 1 MW or higher.

The present invention provides an abnormality detecting apparatus for a solar cell power generation system including a plurality of solar cell strings each having a plurality of solar cell modules connected to each other in series and a backflow preventing diode connected to a power output terminal of each of the solar cell strings, characterized in that the abnormality detecting apparatus further includes measuring means for measuring a current flowing in the backflow preventing diode; and that the measuring means is supplied with electric power from both terminals of the backflow preventing diode.

9 Claims, 8 Drawing Sheets

(56) References Cited

FOREIGN PATENT DOCUMENTS

| JP | 08-185235 | 7/1996 |
| JP | 10-201105 | 7/1998 |
| JP | 10-326902 | 12/1998 |
| JP | 2000-196127 | 7/2000 |
| JP | 2000-269531 | 9/2000 |
| JP | 2001-068706 | 3/2001 |
| JP | 2004-260015 | 9/2004 |

* cited by examiner

*PRIOR ART*

APPARATUS AND METHOD FOR DETECTING ABNORMALITY IN SOLAR CELL POWER GENERATION SYSTEM

TECHNICAL FIELD OF THE INVENTION

The present invention relates to an apparatus and a method for easily detecting an abnormal status of power generation of a solar cell panel in a solar cell power generation system. In particular, the present invention is suitable for the detection of abnormality in a mega solar system of a power generation scale of 1 MW or higher.

BACKGROUND ART

A solar cell power generation system having numerous solar cell panels arranged therein is getting into widespread use in order to effectively utilize solar energy. Such a solar cell power generation system has various kinds such as a small-sized system which is installed on a roof of a house and a large-scaled system which has generation power of mega watt or higher and can provide electric power throughout a region.

As illustrated in FIG. 1, in a typical solar cell power generation system, a solar cell string 101 is configured by connecting in series solar cell modules 111, 112, and 113 combined with bypass diodes 104, respectively, and further, backflow preventing diodes 141 and 142 are connected to the power output terminal of the solar cell string 101. The solar cell string 101 is connected at both ends thereof to power cables 150 and 151, respectively, so as to collect electric power. There are provided numerous solar cell strings 101, each having the above-described configuration. Electric power generated in each of the solar cell strings 101 is collected via the power cables 150 and 151, is sent to a single power collecting terminal apparatus, and thus, is used as an output from the solar cell power generation system.

The bypass diode 104 has the function of, when electromotive force of a certain one of the solar cell modules is degraded, bypassing a current generated in the other solar cell module. Each of the backflow preventing diodes 141 and 142 has a function of preventing any backflow of a current to the solar cell string having a lower potential in the case where a difference in potential is generated between the solar cell strings. In most cases, the backflow preventing diodes 141 and 142 are two diodes connected to each other in series for withstanding a high voltage.

In general, abnormality in the solar cell power generation system has been conventionally detected per solar cell module constituting a solar cell panel or detected per solar cell string consisting of a plurality of solar cell modules.

For example, Patent Document 1 discloses a solar cell module including detecting means for detecting a current or a voltage per solar cell module and communication means for performing communication according to an output from the detecting means, so as to easily specify the occurrence of a failure in the solar cell module and a troubled solar cell module.

Alternatively, Patent Document 2 discloses a characteristic evaluating apparatus for a solar cell, including a measuring unit for measuring current-voltage characteristics in units of a plurality of solar cell modules, a converting unit for converting the measured current-voltage characteristics into a predetermined standard, a memory storing a plurality of standard characteristics therein, and a determining unit for determining by comparing the current-voltage characteristics converted into the standard status and each of the standard characteristics read from the memory.

In the above-described detecting apparatus or evaluating apparatus, in general, a power source for the apparatus is provided between the solar cell modules to be measured or a battery is independently provided for supplying a power to the apparatus. In the former case, a circuit is required for decreasing the obtained high voltage down to a proper use voltage in the order of about 1/100, thereby raising a problem of consumption of a part of electric power generated in the solar cell. In contrast, in the latter case, there arises the problem of control at the time of exhaustion or replacement of a cell, thereby making the apparatus complicated as a whole. Not only the abnormality detecting unit in the solar cell power generation system but also transmission means for the detected data are complicated. Moreover, accurate abnormality detection by a simple apparatus of a low cost has been required for a mega solar system using many solar cell panels.

PRIOR ART DOCUMENT

Patent Document

Patent Document 1: Japanese Patent Application Laid-Open (JP-A) No. 2000-269531
Patent Document 2: Japanese Patent Application Laid-Open (JP-A) No. 2004-260015

DISCLOSURE OF THE INVENTION

Problem that the Invention is to Solve

The present invention has been made in view of the problems of the prior art described above. An object of the present invention is to provide an apparatus and a method for easily detecting an abnormal status of power generation of a solar cell panel in a solar cell power generation system. In particular, an object of the present invention is to provide an apparatus and a method suitable for detecting abnormality in a large-scaled mega solar system constituted from 1000 or more solar cell strings and having the power generation of 1 MW or higher.

Means for Solving the Problem

As a result of earnest study for achieving the above-described objects, the present inventors have focused attention on a backflow preventing diode housed inside of a branch casing disposed at an output terminal of a solar cell string in a solar cell power generation system, and then, have found that data useful for abnormality detection in a solar cell panel can be obtained with a simple configuration by measuring a current flowing in the backflow preventing diode and by obtaining electric power for driving an electric circuit such as measuring means therefrom. Finally, they have reached the completion of the present invention.

That is, the present invention is an abnormality detecting apparatus for a solar cell power generation system including a plurality of solar cell strings each having a plurality of solar cell modules connected to each other in series and a backflow preventing diode connected to a power output terminal of each of the solar cell strings, characterized in that the abnormality detecting apparatus further includes measuring means for measuring a current flowing in the backflow preventing diode; and that the measuring means is supplied with electric power wherein a voltage taken out from both terminals of the backflow preventing diode is converted into a required voltage in a voltage boosting DC converter.

Preferred aspects of the abnormality detecting apparatus for a solar cell power generation system according to the present invention are as follows.

(1) The measuring means measures a voltage between both terminals of the backflow preventing diode and calculates the current flowing in the backflow preventing diode based on the measured voltages.

(2) The measuring means is further equipped with the measuring function for measuring the ambient temperature of the backflow preventing diode and the calculating function for calculating an accurate current value based on the value of the voltage measured by the measuring means and the ambient temperature measured by the measuring function.

(3) The abnormality detecting apparatus further includes wireless communication means for transmitting the measured data.

(4) The wireless communication means can transmit the measured data to another wireless communication means existing within its communication range, so that the measured data can be finally transmitted to a central information control apparatus through each of the wireless communication means in order.

(5) The backflow preventing diode, the measuring means, and the wireless communication means are housed inside of a single casing having a waterproof structure.

(6) The solar cell power generation system is a mega solar system of 1 MW or higher.

Alternatively, the present invention is a method for detecting abnormality of a solar cell power generation system, wherein the solar cell power generation system includes a plurality of solar cell strings each having a plurality of solar cell modules connected to each other in series and a backflow preventing diode connected to a power output terminal of each of the solar cell strings, characterized in that a current flowing in the backflow preventing diode is measured by using, as a power source, electric power wherein a voltage taken out from both terminals of the backflow preventing diode as a and converted into a required voltage in a voltage boosting DC converter is supplied; and that the measured data are transmitted to a central information control apparatus via multi-hop wireless communication means.

Advantages of the Invention

According to the present invention, the current flowing in the backflow preventing diode disposed at the output terminal of the solar cell string is measured, and further, the power source for use in measuring etc. is obtained from the output terminal. Therefore, the abnormal status of the power generation in the solar cell panel can be detected by a remarkably simple configuration without consuming the electric power generated in a solar cell. Moreover, all of the constituent elements for detecting the abnormality can be housed inside of the branch casing containing the backflow preventing diodes therein, thus achieving the simple configuration and safeness. Additionally, the multi-hop wireless communication means are provided for easily transmitting the measured data on the solar cell strings to the central information control apparatus, thus facilitating determination and control of numerous pieces of measured data. As a consequence, the present invention is remarkably useful in the mega solar system using many solar cell panels.

BRIEF DESCRIPTIONS OF DRAWINGS

FIG. 5($b$) is a graph illustrating a relationship between the forward voltage $V_F$ and the current $I_D$, which are measured at each of the temperatures, in the backflow preventing diode.

BEST MODE FOR CARRYING OUT THE INVENTION

A description will be given below of an abnormality detecting apparatus for a solar cell power generation system according to the present invention with reference to figures. However, it should be noted that the present invention is not limited thereto.

Figure 1:
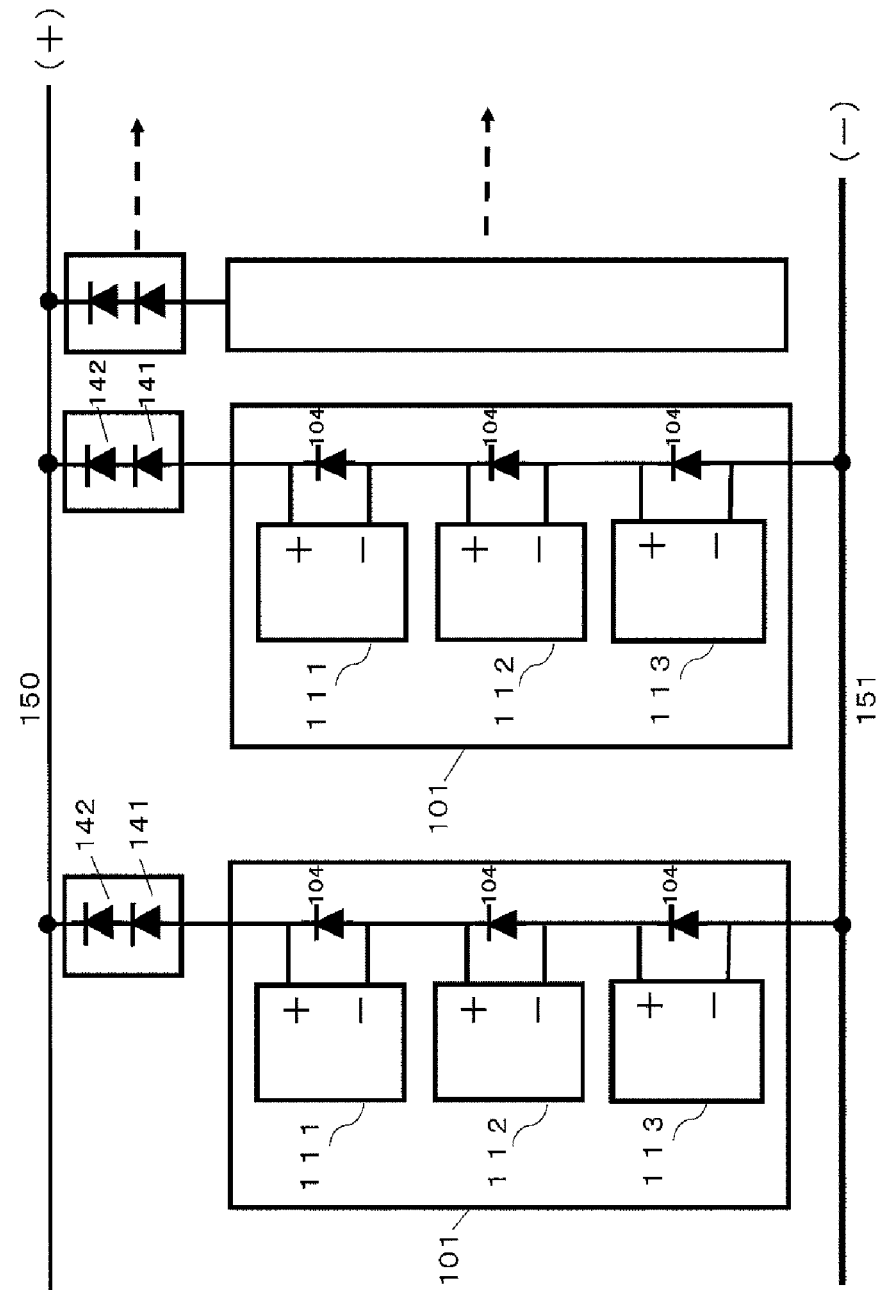
FIG. 1 is an explanatory diagram exemplifying a conventional solar cell power generation system.
Figure 2:
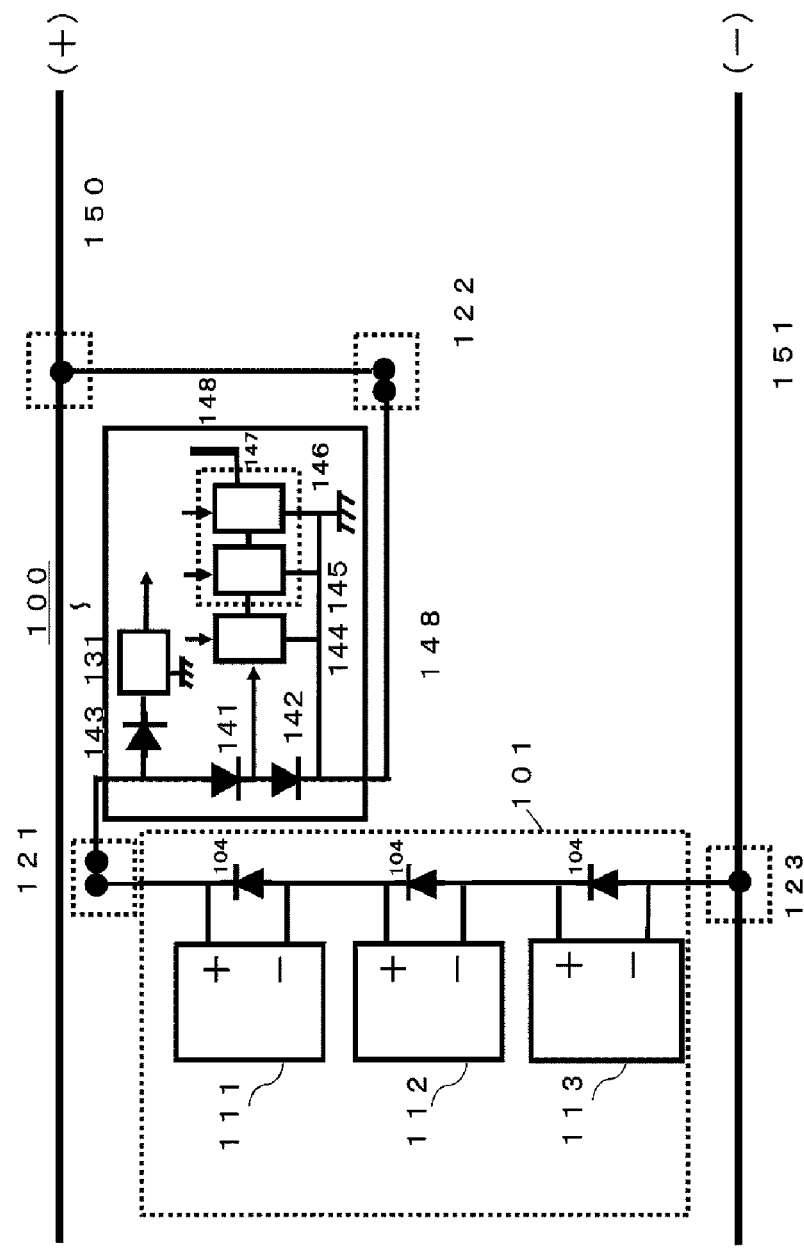
FIG. 2 is a diagram exemplifying an abnormality detecting apparatus for a solar cell power generation system according to the present invention.

FIG. 2 is a diagram exemplifying an abnormality detecting apparatus for a solar cell power generation system according to the present invention. FIG. 2 shows solar cell modules 111, 112, and 113, each having a solar cell panel mounted thereon. A bypass diode 104 is connected in parallel to each of the solar cell modules. The bypass diode 104 is provided for bypassing a generated current supplied from the solar cell module forward and backward in the case where a specified solar cell module cannot generate power due to lack of difference in potential between both terminals thereof by a failure or shade. A solar cell string 101 is configured by connecting the solar cell modules 111, 112, and 113 to each other in series.

A power output generated in the solar cell string 101 is connected to backflow preventing diodes 141 and 142 through a connector 121, passes through the backflow preventing diodes 141 and 142, and then, is supplied to a power cable 150 connected to a power collecting terminal through a connector 122. On the other hand, the other output terminal of the solar cell string 101 is connected to a power cable 151 through a connector 123. The reason why the two backflow preventing diodes 141 and 142 are connected to each other in series is to enhance a reverse diode withstand voltage so as to satisfactorily withstand a reverse voltage applied to the backflow preventing diodes 141 and 142 when a difference in potential between the power cables 150 and 151 is large and a voltage generated in the solar cell module is reduced due to a failure etc.

Although the solar cell string 101 consisting of the three solar cell modules is exemplified in FIG. 2, the number of solar cell modules connected to each other in series inside of the solar cell string 101 may be increased up to about 10 in order to increase the generated voltage up to the withstand voltage of the backflow preventing diode. The number of solar cell strings 101 in a solar cell power generation system depends upon a power generation scale. In general, the number may be widely varied from several tens to several ten thousands.

An abnormality detecting apparatus 100 according to the present invention is characterized in that it includes measuring means for measuring a current flowing in the backflow preventing diode, and that an operation power of a constituent element in the abnormality detecting apparatus such as the measuring means is taken out from both terminals of the backflow preventing diode. A voltage taken out from an anode side of the backflow preventing diode 141 is converted into a required voltage in a voltage boosting DC converter 131 through a reverse withstand voltage protecting diode 143, and is supplied to each of circuits installed inside of the abnormality detecting apparatus. In the case where the abnormality detecting apparatus is required to be operated even when a solar cell can generate no power or only a small amount of power during nighttime or in the shade, the electric power from both terminals of the backflow preventing diode supplied upon power generation can be accumulated in a capacitor or the like.

In the case where the voltage generated in the solar cell string is lower than a potential generated in the power cable 150 due to some factor, the reverse withstand voltage protecting diode 143 allows the voltage boosting DC converter 131 and an electric circuit such as the measuring means to be protected from a large negative breakdown voltage beyond a rating. With the same function and object, the two backflow preventing diodes are connected to each other in series. However, in the case of the reverse withstand voltage protecting diode 143, a rating current at a forward current IF becomes extremely small in comparison with that of the backflow preventing diode. Therefore, a single diode having the performance capable of meeting a required reverse withstand rating voltage value may be selectively adopted.

An input voltage to the voltage boosting DC converter 131 is equal to a voltage lower by a forward drop voltage $V_F$, in which the reverse withstand voltage protecting diode 143 is inserted, than a voltage that is twice a forward voltage $V_F$ between both terminals of the backflow preventing diodes 141 and 142 connected to each other in series, and therefore, results in a small voltage of about 0.7 V. On the other hand, a voltage required for the electric circuit such as the measuring means and wireless communication means can be achieved from about 3 V to about 5 V. The voltage boosting DC converter 131 meeting the demand for the above input and output voltages can be easily implemented by the recent advance of technique.

A current value is the most important information in order to detect the abnormal status of the power generation in the solar cell power generation system. A current generated in the solar cell string 101 passes through the backflow preventing diode. Therefore, the current value generated in the solar cell string 101 can be acquired by measuring the voltage between both terminals of the backflow preventing diode and calculating the current value based on a previously measured relationship between a forward voltage $V_F$ and a current $I_D$ in the backflow preventing diode.

Figure 3:
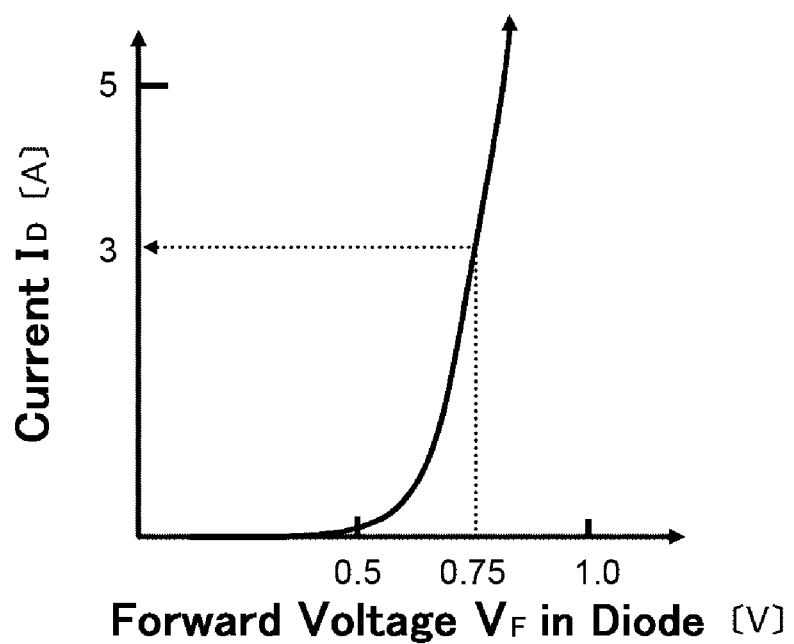
FIG. 3 is a graph illustrating a previously measured relationship between a forward voltage $V_F$ and a current $I_D$ in a backflow preventing diode.

The voltage between both terminals of the backflow preventing diode 142 is measured by a detecting AD converter 144, and the output is converted from the measured voltage into a current value by a calculation control circuit 145. FIG. 3 is a graph illustrating a previously measured relationship between a forward voltage $V_F$ and a current $I_D$ in a backflow preventing diode. In the case where the voltage measured by the detecting AD converter 144 is 0.75 V, the current value becomes 3 A in accordance with the relationship illustrated in this graph. Such data measured as described above are transmitted to a central information control apparatus via a wireless communication circuit 146 and an antenna 147. It is determined based on these data whether or not the power generation status in the solar cell string is abnormal. The above-described abnormality detecting apparatus 100 is housed inside of a single casing 148 having a waterproof structure together with the backflow preventing diodes 141 and 142.

With the above-described configuration, the current value generated in the solar cell string can be obtained by the simple apparatus. However, if ambient temperature around the solar cell string is largely varied, the obtained current value includes a large error. In view of this, description will be made on one example of an apparatus for acquiring information on an accurate current value even in the above-described case.

Figure 4:
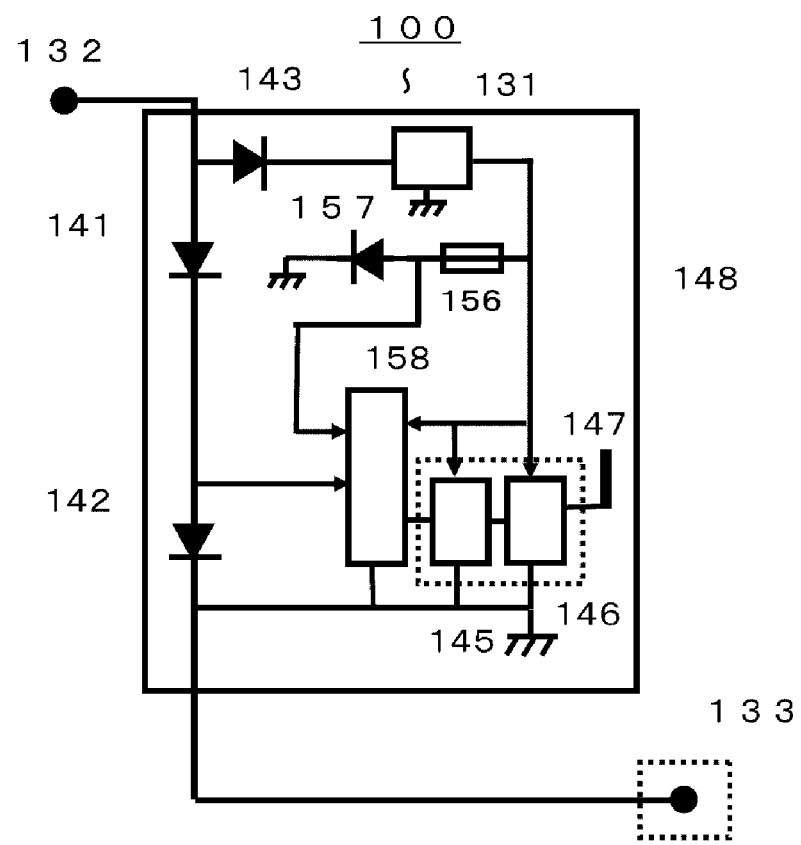
FIG. 4 is a diagram exemplifying an abnormality detecting apparatus equipped with a function of measuring ambient temperature and a function of calculating a correct current value based on the ambient temperature and a measured voltage.

FIG. 4 is a diagram exemplifying an abnormality detecting apparatus equipped with a function of measuring ambient temperature and a function of calculating a correct current value based on the ambient temperature and a measured voltage. In FIG. 4, a voltage boosting DC converter 131 allows the generation of a voltage suitable for actuating electric circuits such as the measuring means and the wireless communication means. Connectors 132 and 133 are connected to an output terminal of a solar cell string and a power cable 150. Backflow preventing diodes 141 and 142 prevent the current from flowing back to the solar cell panels in the case where the voltage generated in the solar cell string is lower than a potential generated in the power cable 150 due to some factor. Furthermore, a reverse withstand voltage protecting diode 143 allows the voltage boosting DC converter 131 and the electric circuit such as the measuring means to be protected in the case where the voltage generated in the solar cell string is lower than the potential generated in the power cable 150 due to some factor. Moreover, this abnormality detecting apparatus includes a calculation control circuit 145, a wireless communication circuit 146, an antenna 147, and a waterproof casing 148.

A temperature detecting diode 157 is supplied with a constant current via a resistance 156 connected to a thermally stable high output voltage in the voltage boosting DC converter 131. Moreover, voltage value obtained by measuring diode forward voltage VF between both terminals of the temperature detecting diode 157 by a multi-channel AD converter 158 is supplied to the calculation control circuit 145 as temperature information. On the other hand, diode forward voltage $V_F$ between both terminals of the backflow preventing diode is measured by the multi-channel AD converter 158, and then transmitted to the calculation control circuit 145.

The calculation control circuit 145 stores therein the relationship between a forward voltage $V_F$ and a current $I_D$ in the backflow preventing diode 142 at each of previously measured temperatures. Based on this relationship, the current value generated in the solar cell string can be more accurately acquired by the calculation based on the temperature information and the voltage $V_F$.

Figure 5A:
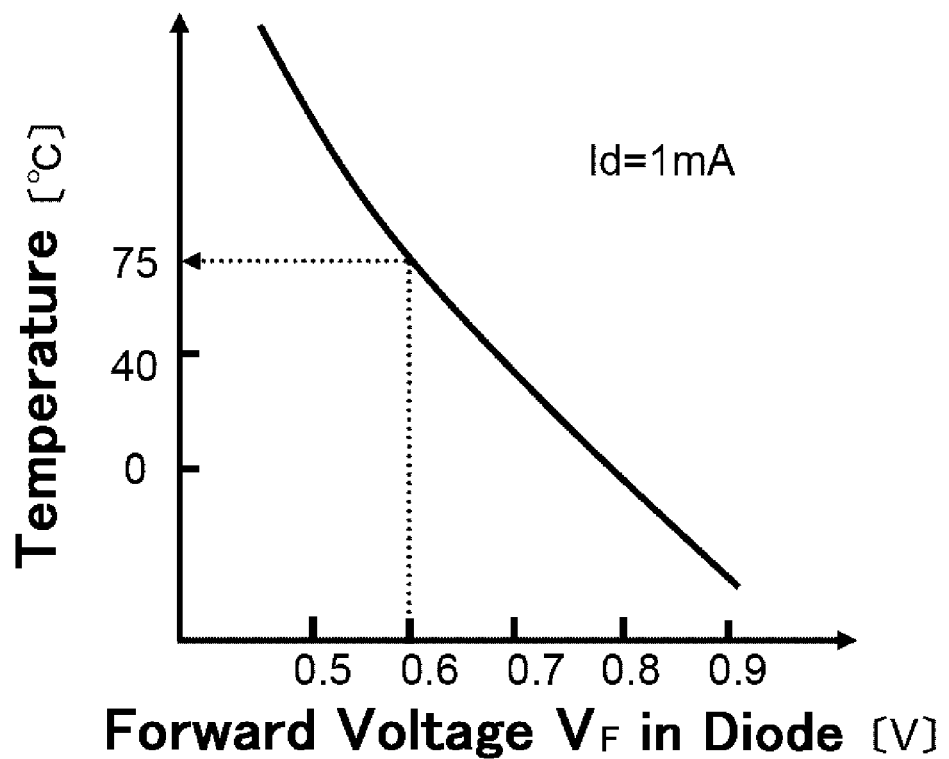
FIG. 5($a$) is a graph illustrating a relationship between a forward voltage VF and a temperature in a temperature detecting diode.
Figure 5B:
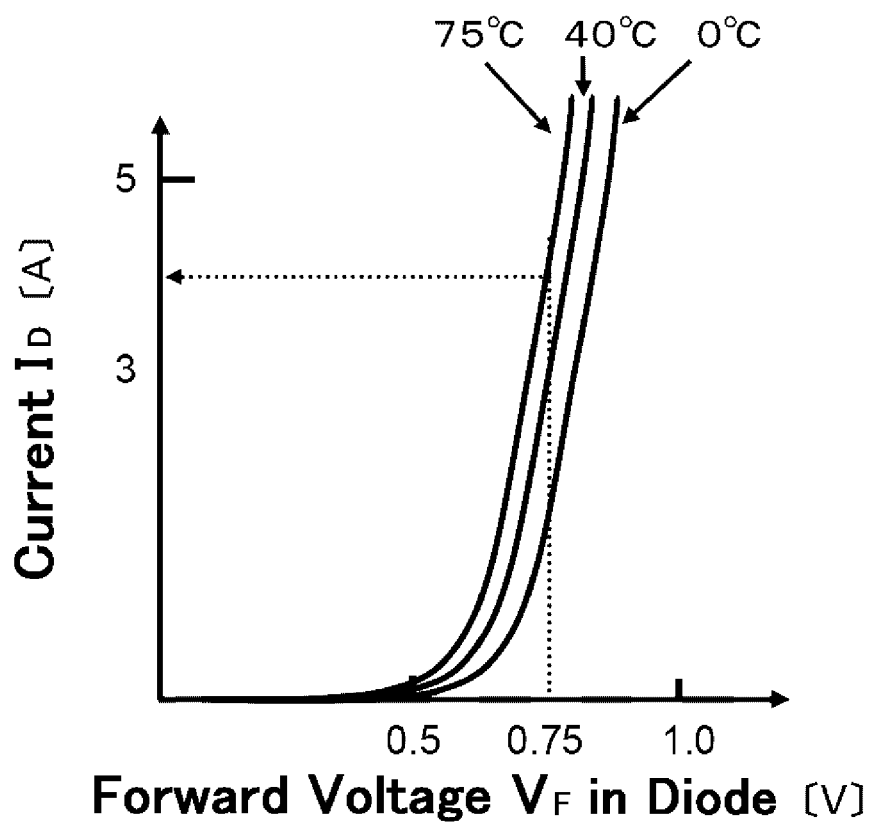

FIG. 5(a) is a graph illustrating a relationship between a forward voltage VF and a temperature in a temperature detecting diode, and FIG. 5(b) is a graph illustrating a relationship between a forward voltage $V_F$ and a current $I_D$, which are measured at each of the temperatures, in a backflow preventing diode. In this graph, a constant current of 1 mA flows in the temperature detecting diode. In the case where the forward voltage VF in the temperature detecting diode is, for example, 0.60 V, the ambient temperature is 75° C. based on the graph of FIG. 5(a). In this case, if the measured voltage between both terminals of the backflow preventing diode is, for example, 0.75 V, a flowing current is calculated as being 4

A based on characteristics curve data at 75° C. in FIG. 5(b). With the above-described method, the current generated in the solar cell string can be more accurately measured without any influence by the ambient temperature than the aforementioned method.

Figure 6:
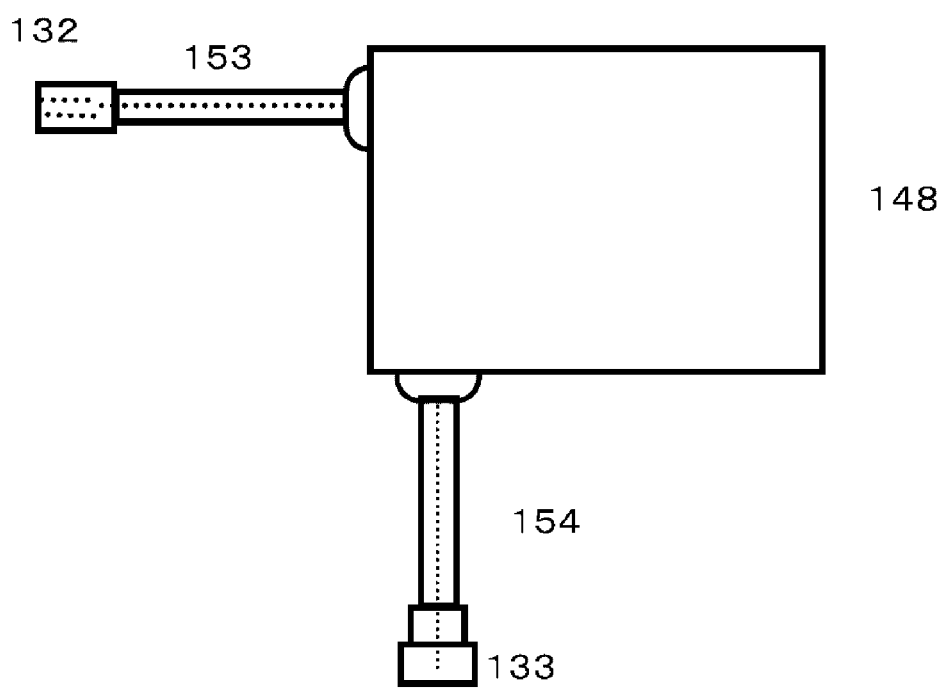
FIG. 6 is a view showing an external appearance of the abnormality detecting apparatus for the solar cell power generation system according to the present invention.

FIG. 6 is a view showing an external appearance of the abnormality detecting apparatus for the solar cell power generation system according to the present invention. In FIG. 6, the waterproof casing 148 has a structure that can stand outdoor use. All of the constituent elements such as the backflow preventing diodes, the measuring means, and the wireless communication means described above are housed inside of the casing 148. The connectors 132 and 133 have a structure of an electric polarity so as to avoid any erroneous connection. Power cables 153 and 154 have a connection length of good operability enough to be connected to the power cables 150 and 151 connected to a power collecting terminal device.

Figure 7:
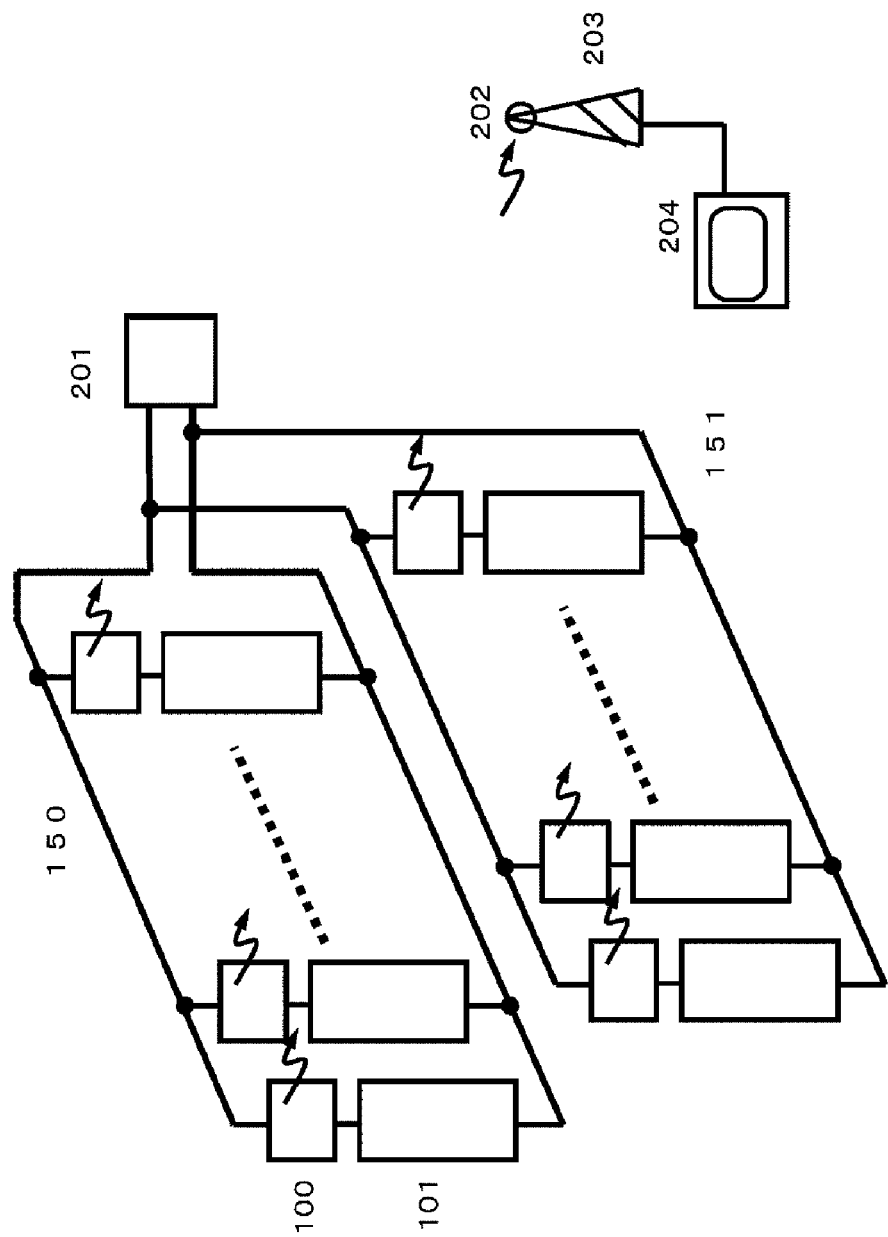
FIG. 7 is a diagram exemplifying maintenance using the abnormality detecting apparatus for the solar cell power generation system according to the present invention.

FIG. 7 is a diagram exemplifying maintenance using the abnormality detecting apparatus for the solar cell power generation system according to the present invention. In FIG. 7, the currents generated in the solar cell strings 101 pass through the abnormality detecting apparatus 100, which houses the backflow preventing diodes therein, are collected in a power collecting terminal apparatus 201 through the power cables 150 and 151, and thus, are processed to become a commercial power source as final outputs in a solar photovoltaic power generating apparatus. The antenna transmits the information on the status of the current generated in each of the solar cell strings etc. with a radio wave from each of the abnormality detecting apparatuses in response to an instruction outputted from a central receiver 203, and then, the information is captured by a central antenna 202, and is then sent to the central receiver 203. The central receiver 203 determines based on the predetermined data whether or not the information on the current etc. is abnormal, and further specifies an abnormal site while displaying a power generation situation by using a central information controlling apparatus 204, and if necessary, issues an instruction of inspection and maintenance. The wireless communication circuit in the abnormality detecting apparatus 100 may transmit the information such as the measurement data to the wireless communication circuit in another abnormality detecting apparatus existing within its communication range, so that the information can be finally transmitted to the central information controlling apparatus via each of the wireless communication means (i.e., multi-hop wireless communication). In this manner, it is possible to easily monitor the status of the solar cell strings with the simple configuration even when the installation area of the solar cell panel is large in scale so that the solar cell strings are located much apart from the central information controlling apparatus.

In the multi-hop wireless communication, the wireless communication circuit 146 in one abnormality detecting apparatus capable of communicating with both of the central antenna 200 and another abnormality detecting apparatus located at a position where a radio wave cannot reach from the central antenna 200 is provided with the function capable of identifying the radio wave from the another abnormality detecting apparatus. When the one abnormality detecting apparatus receives the radio wave, the one abnormality detecting apparatus retransmits the measured data together with its identified information to the central antenna 200.

INDUSTRIAL APPLICABILITY

An abnormality detecting apparatus for the solar cell power generation system according to the present invention can accurately detect an abnormal status of power generation in a solar cell panel with a simple configuration. Moreover, the abnormality detecting apparatus can be easily installed inside of a branch casing incorporating backflow preventing diodes therein, and therefore, installation work is light, thereby reducing installation cost. Consequently, the abnormality detecting apparatus according to the present invention is remarkably useful for abnormality detection in a large-scaled mega solar system including numerous solar cell panels.

EXPLANATION OF REFERENCE NUMBER

100: abnormality detecting apparatus
101: solar cell string
111: solar cell module
112: solar cell module
113: solar cell module
121: connector
122: connector
123: connector
131: voltage boosting DC converter
132: connector
133: connector
141: backflow preventing diode
142: backflow preventing diode
143: reverse withstand voltage protecting diode
144: detecting AD converter
145: calculation control circuit
146: wireless communication circuit
147: antenna
148: waterproof casing
150: power cable
151: power cable
153: power cable
154: power cable
156: resistance
157: temperature detecting diode
158: multi-channel AD converter
201: power collecting terminal apparatus
202: central antenna
203: central receiver
204: central information controlling apparatus

The invention claimed is:

1. An abnormality detecting apparatus for a solar cell power generation system including a plurality of solar cell strings each having a plurality of solar cell modules connected to each other in series and a backflow preventing diode connected to a power output terminal of each of the solar cell strings, characterized in that the abnormality detecting apparatus further includes measuring means for measuring a current flowing in the backflow preventing diode; and that the measuring means is supplied with electric power wherein a voltage taken out from an anode side of the backflow preventing diode is converted into a required voltage in a voltage boosting DC converter.

2. The abnormality detecting apparatus for a solar cell power generation system according to claim 1, wherein measuring means measures a voltage between both terminals of the backflow preventing diode and calculates the current flowing in the backflow preventing diode based on the measured voltages.

3. The abnormality detecting apparatus for a solar cell power generation system according to claim 1, wherein the measuring means is further equipped with the measuring function for measuring the ambient temperature of the backflow preventing diode and the calculating function for calculating an accurate current value based on the value of the voltage measured by the measuring means and the ambient temperature measured by the measuring function.

4. A method for detecting abnormality of a solar cell power generation system, wherein the solar cell power generation system includes a plurality of solar cell strings each having a plurality of solar cell modules connected to each other in series and a backflow preventing diode connected to a power output terminal of each of the solar cell strings, characterized in that a current flowing in the backflow preventing diode is measured by using, as a power source, electric power wherein a voltage taken out-from an anode side of the backflow preventing diode and converted into a required voltage in a voltage boosting DC converter is supplied; and that the measured data are transmitted to a central information control apparatus via multi-hop wireless communication means.

5. The abnormality detecting apparatus for a solar cell power generation system according to claim 1, wherein the voltage taken out from an anode side of the backflow preventing diode is supplied to the voltage boosting DC converter through a reverse withstand voltage protecting diode.

6. The abnormality detecting apparatus for a solar cell power generation system according to any one of claim 1, 2, 3, or 5, wherein the abnormality detecting apparatus further includes wireless communication means for transmitting the measured data.

7. The abnormality detecting apparatus for a solar cell power generation system according to any one of claim 1, 2, 3, or 5, wherein the solar cell power generation system is a mega solar system of 1 MW or higher.

8. The abnormality detecting apparatus for a solar cell power generation system according to claim 6, wherein the wireless communication means can transmit the measured data to another wireless communication means existing within its communication range, so that the measured data can be finally transmitted to a central information control apparatus through each of the wireless communication means in order.

9. The abnormality detecting apparatus for a solar cell power generation system according to claim 7, wherein the backflow preventing diode, the measuring means, and the wireless communication means are housed inside of a single casing having a waterproof structure.

* * * * *